(12) United States Patent
Grübl et al.

(10) Patent No.: US 11,992,927 B2
(45) Date of Patent: May 28, 2024

(54) PNEUMATIC CHIPPING HAMMER

(71) Applicant: Wacker Chemie AG, Munich (DE)

(72) Inventors: Peter Grübl, Eichendorf (DE); Martin Brixel, Kirchdorf (DE)

(73) Assignee: Wacker Chemie AG, Munich (DE)

( * ) Notice: Subject to any disclaimer, the term of this patent is extended or adjusted under 35 U.S.C. 154(b) by 471 days.

(21) Appl. No.: 17/283,176

(22) PCT Filed: Oct. 8, 2018

(86) PCT No.: PCT/EP2018/077344
§ 371 (c)(1),
(2) Date: Apr. 6, 2021

(87) PCT Pub. No.: WO2020/074058
PCT Pub. Date: Apr. 16, 2020

(65) Prior Publication Data
US 2021/0339370 A1   Nov. 4, 2021

(51) Int. Cl.
*B25D 9/02* (2006.01)
*B02C 1/00* (2006.01)
*B25D 9/08* (2006.01)
*B25D 17/24* (2006.01)
*C30B 29/06* (2006.01)
*C30B 35/00* (2006.01)

(52) U.S. Cl.
CPC ............... *B25D 9/02* (2013.01); *B02C 1/005* (2013.01); *B25D 9/08* (2013.01); *B25D 17/24* (2013.01); *C30B 29/06* (2013.01); *C30B 35/007* (2013.01); *B25D 2217/0073* (2013.01); *B25D 2250/181* (2013.01)

(58) Field of Classification Search
CPC .. B25D 9/02; B25D 9/08; B25D 17/24; B02C 1/005; C30B 29/06; C30B 35/007
See application file for complete search history.

(56) References Cited

U.S. PATENT DOCUMENTS

| | | | |
|---|---|---|---|
| 4,088,062 A | * | 5/1978 | Nilsson ..................... E02D 7/10 91/335 |
| 4,367,800 A | | 1/1983 | Arentsen |

(Continued)

FOREIGN PATENT DOCUMENTS

| | | |
|---|---|---|
| CN | 102600948 A | 7/2012 |
| CN | 206140419 U | 5/2017 |

(Continued)

OTHER PUBLICATIONS

Pneumatic and hydraulic transmission control technology (4th edition), Haiqing Hu, Beijing Institute of Technology Press, pp. 33-34, Aug. 2014.

*Primary Examiner* — Nathaniel C Chukwurah

(57) ABSTRACT

A pneumatic chisel includes a housing having a double-acting pneumatic cylinder in which a piston including a chisel is movably arranged along a longitudinal axis. The cylinder has a work-side section and a return-side section. The return-side section includes a damping portion and a pressure-equalization opening. The work-side section includes an end-position damping member and a compressed air connection. A compressed air reservoir is connected to the return-side section of the cylinder. A chisel guide housing includes a sealing air chamber. The piston is constructed as one piece with the chisel.

14 Claims, 2 Drawing Sheets

(56) References Cited

U.S. PATENT DOCUMENTS

| | | | |
|---|---|---|---|
| 4,747,455 A | | 5/1988 | Cunningham |
| 5,927,329 A | * | 7/1999 | Yie ..................... B05B 1/3046 251/30.01 |
| 7,434,503 B2 | | 10/2008 | Comarmond |
| 2006/0243834 A1 | | 11/2006 | Schantz et al. |
| 2010/0025060 A1 | | 2/2010 | Yamane et al. |
| 2011/0068206 A1 | | 3/2011 | Kondou |
| 2014/0034763 A1 | | 2/2014 | Mattes et al. |
| 2016/0311104 A1 | * | 10/2016 | Watanabe ................ B25D 9/08 |
| 2016/0339485 A1 | | 11/2016 | Nishimura et al. |

FOREIGN PATENT DOCUMENTS

| | | |
|---|---|---|
| EP | 2077252 B1 | 2/2017 |
| EP | 2308598 B1 | 9/2018 |
| JP | 55116924 A | 9/1980 |
| KR | 101089241 B1 | 12/2011 |
| KR | 20160122704 A | 10/2016 |
| WO | 2010016479 A1 | 2/2010 |

\* cited by examiner

PNEUMATIC CHIPPING HAMMER

CROSS-REFERENCE TO RELATED APPLICATION

This application is a U.S. National Phase Application of PCT/EP2018/077344, filed Oct. 8, 2018, the contents of which is hereby incorporated by reference in its entirety.

BACKGROUND

The invention relates to a pneumatic chisel and to an apparatus comprising such a pneumatic chisel for comminuting at least one polycrystalline silicon rod.

Polycrystalline silicon (polysilicon) is typically produced by the Siemens process—a chemical gas phase deposition process. This comprises heating thin filament rods (slim rods) composed of silicon in a bell-shaped reactor (Siemens reactor) by direct passage of current and introducing a reaction gas comprising a silicon-containing component and hydrogen. The silicon-containing component is generally monosilane ($SiH_4$) or a halosilane of the general composition $SiH_nX_{4-n}$ (n=0, 1, 2, 3; X=Cl, Br, I). It is typically a chlorosilane or a chlorosilane mixture, usually trichlorosilane ($SiHCl_3$, TCS). The structure of a typical Siemens reactor is described by way of example in EP 2 077 252 A2.

The thin rods are received by electrodes anchored in the bottom of the reactor. Typically, two slim rods are connected via a bridge to form a slim rod pair that forms a circuit via the electrodes. The surface temperature of the filament rods is typically more than 1000° C. At these temperatures, the silicon-containing component of the reaction gas decomposes and elemental silicon is deposited from the vapor phase onto the rod surface as polysilicon. This causes the diameter of the slim rods to increase. After achieving a predetermined diameter the deposition is typically terminated and the obtained U-shaped silicon rods are deinstalled. After removal of the bridge, approximately cylindrical silicon rods are obtained.

Polysilicon is the starting material in the production of monocrystalline silicon which is produced, for example, by the Czochralski process (crucible pulling). Polysilicon is also needed for the production of multicrystalline silicon, for example by means of block casting processes. Both processes require that the rod-shaped polysilicon is initially comminuted into chunks. The purity of the polysilicon is of decisive importance for these subsequent processes since contamination generally leads to dislocation defects (one-dimensional, i.e. linear faults) and stacking defects (two-dimensional, i.e. planar faults) in the crystal structure. Both phenomena reduce yield since in principle only silicon crystals that do not exceed a certain number of crystal defects are suitable for use in the photovoltaics and electronics industries.

Various processes for comminuting polysilicon rods are known.

CN102600948A describes a plant for fully automatic comminution of polysilicon rods. The plant comprises not only a comminuting unit but also a transporting apparatus by means of which the rods are supplied to the comminution apparatus along their longitudinal axis.

Comminution is effected from two sides via two batteries of chisels arranged along a longitudinal axis. The disadvantage here is that the position of the chisels cannot be adapted to diameters varying over the rod length.

US2010/025060A1 describes a hand-operated pneumatic breaker wherein a piston in a guide tube is accelerated onto a hammer head arranged at the end of the guide tube using compressed air (hammer and chisel principle).

EP2308598A1 describes a comminution apparatus having a unit which is displaceable along the rod longitudinal axis and carries a plurality of impacting units arranged at various angles to one another. The impacting units are based on the Hammer-chisel principle. The comminuted polysilicon is discharged in a chunk trough.

US2006/243834A describes an apparatus for comminuting a polysilicon rod, wherein the rod is located on a height-adjustable base and is aligned there between comminuting chisels and counterchisels such that all chisels are in contact with the silicon rod. The comminuted polysilicon is discharged via a trough arranged below the base. The disadvantage here is that the relatively high fall height of the comminuted silicon can result in postcomminution.

A common feature of the known processes is that they cannot ensure low-contamination comminution of polysilicon rods. A substantial problem is the two-piece configuration of the impacting units. These are constructed according to the hammer and chisel principle, i.e. a generally pneumatically accelerated piston is decoupled from the chisel impacting the polysilicon. This results in elevated abrasion and thus elevated contamination of the comminuted polysilicon. The known impacting units are in principle configured as oscillating systems. The oscillating motion of the two decoupled components (piston and chisel) is also associated with high abrasion. The service life of the components is also unsatisfactory.

Comminuted polysilicon having the lowest contamination is presently obtainable exclusively by manual comminution. The silicon is typically broken with just a few targeted hammer blows. Manual comminution is associated with considerable stress on the person performing the procedure. Against the backdrop of increasingly efficient deposition processes with increasing batch sizes, rod lengths and rod diameters, manual comminution is no longer economic and no longer acceptable for health reasons in particular. The object of the present invention arose from these problems.

BRIEF SUMMARY

Embodiments of a pneumatic chisel are described below. In an embodiment, the pneumatic chisel comprises a housing having a double-acting pneumatic cylinder in which a piston comprising a chisel is movably arranged along a longitudinal axis. The cylinder has a work-side section and a return-side section. The return-side section comprises a damping portion and a pressure-equalization opening. The work-side section comprises an end-position damping member and a compressed air connection. A compressed air reservoir is connected to the return-side section of the cylinder. A chisel guide housing comprises a sealing air chamber. The piston is constructed as one piece with the chisel.

Embodiments of an apparatus for comminuting at least one polycrystalline silicon rod are also described below.

BRIEF DESCRIPTION OF THE SEVERAL VIEWS OF THE DRAWING

The above, as well as other advantages of the present invention will become readily apparent to those skilled in the art from the following detailed description when considered in the light of the accompanying drawings in which.

DETAILED DESCRIPTION

Figure 1:
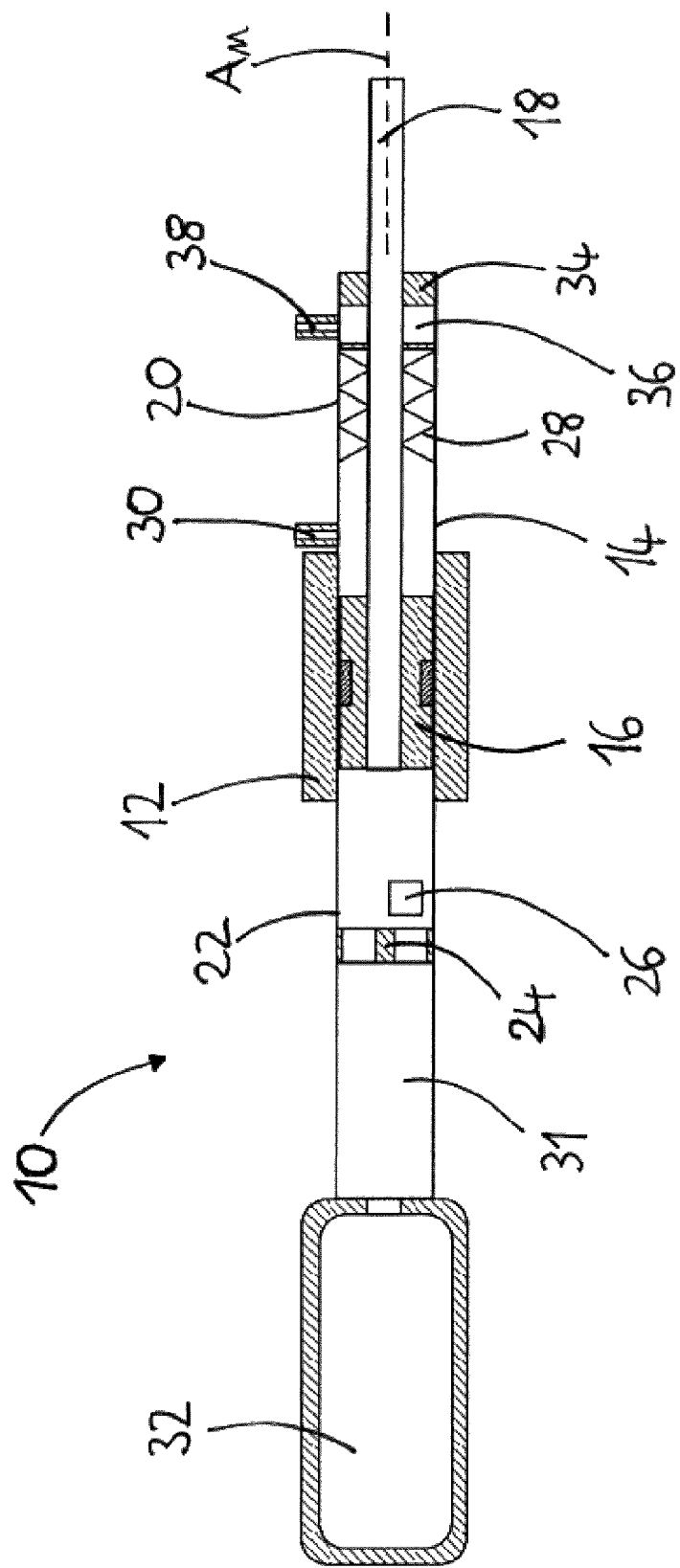
FIG. 1 is a cross-sectional view of an embodiment of a pneumatic chisel in accordance with the invention.

This object is achieved by a pneumatic chisel which is suitable in particular for comminuting polysilicon and comprises the following components:
- a housing having a double-acting pneumatic cylinder in which a piston comprising a chisel is movably arranged along a longitudinal axis, wherein the cylinder has a work-side section and a return-side section, wherein the return-side section comprises a damping portion and a pressure-equalization opening and wherein the work-side section comprises an end-position damping member and a compressed air connection,
- a compressed air reservoir connected to the return-side section of the cylinder and
- a chisel guide housing comprising a sealing air chamber.

The pneumatic chisel particularly advantageously allows comminution both by means of single impact and by means of multiple impacts (oscillating). Comminution by means of single impact significantly reduces the ingress of contamination into the comminution product.

The polysilicon is in particular a polysilicon rod from the Siemens process. The polysilicon rod is a substantially cylindrical object having a substantially circular cross section having a longitudinal axis and a transverse axis. Typical diameters of such a polysilicon rod are currently between 100 and 280 mm. Typical lengths are between 2 and 3 m. However, the suitability of the pneumatic chisel for comminuting is in principle independent of the dimensions of the polysilicon.

The end-position damping member arranged in the work-side section (or work-side end) of the cylinder is preferably a fluidic, in particular pneumatic, or mechanical end-position damping member. Particular preference is given to a mechanical end-position damping member, in particular in the form of at least one Belleville washer. Furthermore, the mechanical end-position damping member may also be one or more damping washers.

In a preferred embodiment the work-side section of the cylinder further comprises a pressure-equalization opening. However, the compressed air connection usually also fulfills the function of a pressure-equalization opening.

The piston is preferably constructed as one piece with the chisel. In other words the piston is preferably insolubly joined to the chisel. However, it is also conceivable for the piston and the chisel to be solubly joined to one another, for example by means of a screw connection.

The chisel preferably has a dome-shaped, in particular semicircular, end. This achieves a reduction in the required comminution energy. Reducing the comminution energy has consequences for subsequent product contamination and for the service life of the pneumatic chisel. The dome shape of the chisel end further makes it possible to reduce critical stress states occurring in the chisel. The choice of exact shape is typically carried out according to the material to be comminuted. The dome shape is particularly preferred for comminuting polysilicon.

The chisel and/or the piston are preferably made of a material selected from the group comprising sintered material (metal powder), metal, metal alloy, hard metal (for example tungsten carbide in cobalt or nickel matrix) and combinations thereof. The sintered material may be tungsten carbide for example. The cylinder and/or the chisel guide housing may also be made of the above-described material.

The chisel and/or the piston may at least partially comprise a coating (for example polytetrafluoroethylene, carbon fiber or generally coatings applied by physical vapor deposition (PVD)). The same applies to the cylinder and/or the chisel guide housing.

The chisel guide housing is preferably sealed to the environment with a plastic, in particular polyurethane. The seal is especially effected in the region of the opening through which the chisel is guided.

The sealing air chamber of the chisel guide housing particularly advantageously prevents contamination of the product to be comminuted. The particles formed by the motion of the piston and the chisel are transported away via an opening in the sealing air chamber before they can arrive at the comminuted product.

The object of the invention is further achieved by an apparatus for comminuting at least one polycrystalline silicon rod. The apparatus comprises
- a rod cradle having a portion movable along an axis A and an immovable portion, wherein a first cradle surface of the movable portion and a second cradle surface of the immovable portion are arranged at an angle of 70° to 130° to one another,
- a sealable breaking chamber in which the rod cradle is arranged and which comprises a chisel feedthrough and
- at least one described pneumatic chisel which is mounted externally to the breaking chamber on a carrier running parallel to a longitudinal axis of the rod cradle.

The first cradle surface of the movable portion and the second cradle surface of the immovable portion are preferably arranged at an angle of 80° to 120°, in particular of 85° to 110°, to one another. It is particularly preferable when the angle is about 90°.

The apparatus preferably comprises 4 to 10, particularly preferably 11 to 17, in particular 18 to 25 pneumatic chisels. The pneumatic chisels are preferably arranged in a row.

It is preferable when at least some of the pneumatic chisels are displaceably mounted on the carrier. This makes it possible to vary the distance between the chisels and optionally adjust the degree of comminution. It may further be provided that the pneumatic chisel(s) is/are pivotable transversely to its/their longitudinal axis.

The carrier may further be movable relative to the rod cradle. Said carrier is preferably movable in all spatial directions and optionally pivotable about its longitudinal axis.

The rod cradle is likewise preferably movable relative to the carrier. The rod cradle may for example also be displaceable only along its longitudinal axis and/or along a further axis, in particular perpendicularly to the longitudinal axis. It is particularly preferable when the rod cradle is movable in all spatial directions.

On the one hand, the mobility of the carrier and/or of the rod cradle makes it possible to precisely adjust the distance between the chisel(s) and the silicon rod to be comminuted. It is thus possible to always set an optimal position for various rod diameters. On the other hand, the impact point of the chisel on the rod surface can be precisely specified. This especially makes it possible to control the chunk size and the impact energy to be employed.

Due to possible diameter differences over the silicon rod length the described separate positionability of the pneumatic chisel is very helpful and results in particularly homogenous breaking. It is also possible to employ diameter and position detection using contactless sensors via the fixing and orientation of the silicon rod in the rod cradle. Through appropriate evaluation each pneumatic chisel may be positioned according to the rod dimensions. Such sensors also make it possible to avoid so-called free hits and thus increase the service life of the apparatus.

The impact sequence of the pneumatic chisel is preferably freely choosable by means of a software-assisted program. In particular, the described sensors may be used to calculate an optimal impact sequence according to specified parameters.

The impact sequence may be varied in particular according to the type of the polysilicon to be comminuted and/or according to the desired chunk size.

In a preferred embodiment a conveying means, in particular a conveyor belt, for transporting away silicon chunks is arranged below the rod cradle. The conveying means preferably runs parallel to the longitudinal axis of the rod cradle. After the comminution operation the silicon chunks are located in the rod cradle. The rod cradle thus also serves as a chunk trough. By displacement of the portion of the rod cradle movable along the axis A (opening of the rod cradle) the chunks are transferred to the conveying means. Due to the avoidance of a tipping motion the potential energy of the chunk material is reduced. This results in a reduced drop height into the conveying means, thus avoiding undesired postcomminution and increasing the service life of lining materials (in particular silicon).

The two-piece configuration of the rod cradle further offers the possibility of comminuting with a slightly opened slot between the fixed and the movable part. This allows any contaminated dust present during the comminution operation to be discharged/extracted from the chunk trough. It is preferable when a controllable extractor is installed below the rod cradle.

Opening the rod cradle initiates dropping of the chunk material onto the conveying means. Opening is preferably initiated according to the fill level of the rod cradle. The amount of chunk material from the preceding comminution operation may be used. This makes it possible to avoid dropping onto previously broken polysilicon on the conveying means and thus undesired postcomminution.

It is preferable when the first cradle surface and/or the second cradle surface of the rod cradle comprises crossbraces (perpendicular to the longitudinal axis of the rod cradle). The crossbraces of the first cradle surface of the movable portion may be arranged offset relative to the crossbraces of the cradle surface of the immovable portion. This makes it possible to achieve better comminution.

It is preferable when in cross section the rod cradle has a hollow chamber profile which may be filled for example with concrete, in particular polymer concrete. This results in reduced natural oscillation and better damping properties.

In a further embodiment the breaking chamber is sealable with a sliding door, folding door or trapdoor to prevent ingress of dust. The breaking chamber is preferably sealed automatically before the comminution process is carried out.

The breaking chamber may further be connected to an extractor which is activated during the comminution process in particular.

The chisel feedthrough of the breaking chamber is preferably sealed with a plastic, in particular polyurethane. It may also be preferable to secure the breaking chamber from ingress of dust by generation of positive pressure.

Air circulation through the sealed breaking chamber may be specifically controlled. It is thus possible to extract contaminated dust stirred up during the comminution operation and avoid ingress of contamination from external sources.

In a further embodiment a material receiver table is attached to the breaking chamber. This is preferably separated from the breaking chamber by the sliding door, folding door or trapdoor. A new silicon rod may already be positioned on the material feed table during the comminution operation, thus allowing particularly efficient operation. A manual pre-comminution may optionally be carried out on the receiver table. The receiver table is preferably likewise enclosed with the exception of an access opening on one side and may optionally be equipped with an extractor.

All lining parts of the apparatus, in particular those coming into contact with the polysilicon, are preferably made of an abrasion resistant material such as for example hard metals, plastics (for example polyurethanes) or else silicon.

FIG. 1 shows a pneumatic chisel 10 according to the invention in cross section. The pneumatic chisel 10 comprises a housing 12 which at least partially surrounds a cylinder 14. The cylinder 14 may also be entirely surrounded by the housing 12. With a chisel 18, arranged in the cylinder 14 is a piston 16 movable along an axis $A_M$. The piston 16 and the chisel 18 form one unit (one-piece construction) and are made from tungsten carbide. The cylinder 14 has a work-side section 20 pointing in the direction of the object to be comminuted and a return-side section 22 facing away therefrom. Arranged in the work-side section 22 is an end-position damping member 28 in the form of a Belleville washer. The work-side section 22 further comprises a compressed air connection 30 which also functions as a pressure-equalization opening. Located in the return-side section 22 is a damping washer as damping portion 24. The return-side section 22 is further provided with a pressure-equalization opening 26 and connected via a connection piece 31 to a compressed air reservoir 32. Attached to the work-side section 22 of the cylinder is a chisel guide housing 34 comprising a sealing air chamber 36 and an opening 38.

In FIG. 1 the piston 16 is in a central position between a return position and an end position. At commencement of a comminution impact the piston 16 is typically at the stop of the damping portion 24 (return position). The compressed air reservoir 32 is filled with a predetermined amount of compressed air according to the material to be comminuted. After achieving the target pressure a valve integrated into the compressed air reservoir 32 is opened, thus via the connecting piece 31 abruptly admitting the compressed air into the cylinder 14 and accelerating the piston 16 in the direction of the end-position damping member 28. The chisel 18 accordingly performs a single impact on the material to be comminuted. The piston 16 comes to rest in the end position at the stop of the end-position damping member 28. The excess compressed air can escape via the openings 30, 26. Any abrasion particles formed by the motion of piston 16 and chisel 18 are transported away via the opening 38 of the sealing air chamber 36 before they can reach the comminuted material.

For another impact a small amount of compressed air is introduced into the cylinder 14 via the compressed air connection 30 and brings the piston 16 back into the return position. The cylinder 14 is thus a double-acting pneumatic cylinder. Through precise timing of compressed air feeding from the reservoir 32 and the connection 30 the piston 16/chisel 18 may be set into an oscillating motion but without exhibiting the disadvantages of the hammer and chisel principle of comminutors hitherto known from the prior art.

Figure 2:
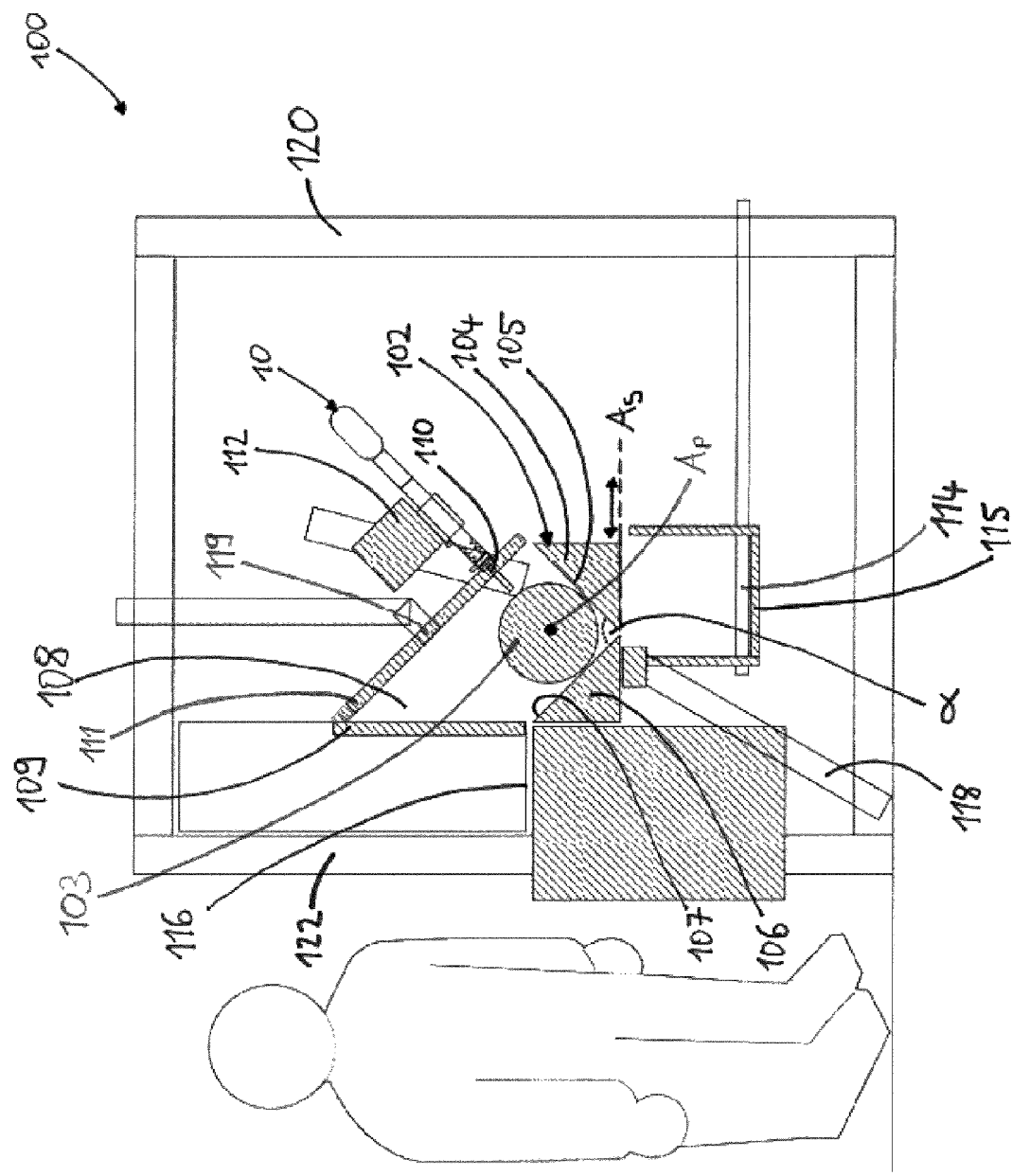
FIG. 2 is a cross-sectional view of an embodiment of an apparatus in accordance with the invention.

FIG. 2 shows a cross section through an apparatus 100 according to the invention for comminuting polycrystalline silicon rods. The apparatus 100 comprises a rod cradle 102 comprising an immovable portion 106 and a movable portion 104 displaceable along the axis (or plane) As. The movable portion 104 has a first cradle surface 105 which is arranged at an angle α of 90° to a second cradle surface 107 of the immovable portion 106. The cradle surfaces 105, 107 form a hollow in which a polysilicon rod 103 having a longitudinal axis $A_P$ is arranged and fixed. The axis $A_P$ runs parallel to the longitudinal axis of the rod cradle 102. The silicon rod is located in a breaking chamber 108 which is sealable by a bulkhead 109.

Externally to the breaking chamber 108, 21 pneumatic chisels 10 (cf. FIG. 1) are mounted on a carrier 112 in a row (parallel to their longitudinal axes $A_M$). An optimal distance between the pneumatic chisels 10 may be in the range from 5 and 15 cm (measured between the chisel ends). A wall 111 of the breaking chamber 108 has a chisel feedthrough 110 lined with a polyurethane plastic to prevent ingress of dust. Also opening into the wall 111 is an extractor 119.

Arranged below the rod cradle 102 are a conveying means 114 for transporting away silicon chunks and a further extractor 118. In order to prevent contamination the conveying means 114 is located in a housing 115.

Located in front of the bulkhead 109 sealing the breaking chamber 118 is a material receiver table 116. The entire apparatus 100 is surrounded by a housing 120 which is open on one access side 122.

To comminute silicon rods a silicon rod 103 is initially conveyed onto the material receiver table 116. This may be effected manually or with a crane. A pre-comminution may optionally be carried out on the receiver table 116. The rod 103 is then rolled into the rod cradle 102 with the bulkhead 109 open. The bulkhead 109 closes and the breaking chamber 108 is now substantially hermetically sealed. The material receiver table 116 now generally already receives the next rod 103.

With the aid of sensors (for example laser scan) the rod 103 is measured to establish the optimal position of the 21 pneumatic chisels 10. This depends in particular on the diameter of the rod but also on the desired degree of comminution and the type of silicon. The morphology of the silicon in particular plays a role here. For example, a distinction is made between porous silicon rods (solar standard) and compact rods (SEMI standard) which can have a high internal stress. The rod 103 is now moved up to the chisel 18 by displacing the rod cradle 102. A fine adjustment of each individual pneumatic chisel 10 may likewise be carried out. An optimal distance between the rod surface and a chisel 18 is typically in a range from 5 and 30 mm. It is particularly advantageously unnecessary for the chisel 18 to be in contact with the rod 103 before comminution. Furthermore, the amount of compressed air and thus the impact strength are adjusted according to the diameter, the desired degree of comminution and the type of silicon. Typical values are in the range from 150 Joule to 700 Joule here. Once the pneumatic chisels 10 have been activated, wherein a single impact of each pneumatic chisel 10 is generally sufficient, the movable portion 104 of the rod cradle 102 is opened and the comminuted silicon transferred into the conveying means 114. The extractors 119, 118 are in principle activated during the comminution operation. The comminuted silicon is transported away and typically supplied to a packaging apparatus. Immediately after the rod cradle 102 is closed again the bulkhead 109 opens to accommodate the next rod 103. Comminution of a rod 103 (measured from placement on the material receiver table 116 until reopening of the bulkhead 109) generally takes 10 to 40 seconds.

The invention claimed is:

1. A pneumatic chisel, in particular for comminuting polycrystalline silicon, comprising:
    a housing having a double-acting pneumatic cylinder in which a piston comprising a chisel is movably arranged along a longitudinal axis, wherein the cylinder has a work-side section and a return-side section, wherein the return-side section comprises a damping portion and a pressure-equalization opening and wherein the work-side section comprises an end-position damping member and a compressed air connection;
    a compressed air reservoir connected to the return-side section of the cylinder; and
    a chisel guide housing comprising a sealing air chamber and an opening for transporting away any abrasion particles formed by the motion of the piston and the chisel, wherein the piston is constructed as one piece with the chisel.

2. The pneumatic chisel as claimed in claim 1, wherein the end-position damping member is a fluidic, in particular pneumatic, or mechanical end-position damping member.

3. The pneumatic chisel as claimed in claim 1, wherein the work-side section comprises a pressure-equalization opening.

4. The pneumatic chisel as claimed in claim 1, wherein the chisel and/or the piston are made of a material selected from the group comprising sintered material, metal, metal alloy and combinations thereof.

5. The pneumatic chisel as claimed in claim 1, wherein the chisel and/or the piston at least partially comprise a coating.

6. The pneumatic chisel as claimed in claim 1, wherein the chisel guide housing is sealed to the environment with a plastic.

7. An apparatus for comminuting at least one polycrystalline silicon rod, comprising:
    a rod cradle having a portion movable along an axis As and an immovable portion, wherein a first cradle surface of the movable portion and a second cradle surface of the immovable portion are arranged at an angle of 70° to 130° to one another;
    a sealable breaking chamber in which the rod cradle is arranged and which comprises a chisel feedthrough; and
    at least one pneumatic chisel as claimed in claim 1, which is mounted externally to the breaking chamber on a carrier running parallel to a longitudinal axis of the rod cradle.

8. The apparatus as claimed in claim 7, comprising 4 to 25 pneumatic chisels.

9. The apparatus as claimed in claim 7, wherein the pneumatic chisel is at least partially displaceably mounted on the carrier.

10. The apparatus as claimed in claim 7, wherein the carrier is movable relative to the rod cradle.

11. The apparatus as claimed in claim 7, wherein the rod cradle is movable relative to the carrier.

12. The apparatus as claimed in claim 7, wherein a conveying means for transporting away silicon chunks is arranged below the rod cradle.

13. The apparatus as claimed in claim 7, wherein a material receiver table is attached to the breaking chamber.

14. The apparatus as claimed in claim 7, wherein the breaking chamber is connected to at least one extractor.

* * * * *